United States Patent
Tsukuda

(10) Patent No.: US 9,344,087 B2
(45) Date of Patent: May 17, 2016

(54) CLOCK TREE UNIT CELL CIRCUIT, CLOCK TREE, AND APPARATUS

(71) Applicant: Sony Corporation, Tokyo (JP)

(72) Inventor: Yasunori Tsukuda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/638,624

(22) Filed: Mar. 4, 2015

(65) Prior Publication Data
US 2015/0280710 A1    Oct. 1, 2015

(30) Foreign Application Priority Data
Mar. 25, 2014    (JP) .................................. 2014-062644

(51) Int. Cl.
| | | |
|---|---|---|
| G06F 1/06 | (2006.01) | |
| G06F 1/10 | (2006.01) | |
| H03K 19/003 | (2006.01) | |
| G06F 1/04 | (2006.01) | |

(52) U.S. Cl.
CPC ............ H03K 19/00315 (2013.01); G06F 1/04 (2013.01)

(58) Field of Classification Search
CPC ............... G06F 1/04; G06F 1/10; G06F 1/06; H03K 19/00315
USPC ........ 326/98, 93; 327/172, 291, 261; 713/503
See application file for complete search history.

(56) References Cited

U.S. PATENT DOCUMENTS

2010/0321065 A1* 12/2010 Wada ..................... G11C 19/00
326/93

FOREIGN PATENT DOCUMENTS

JP    2006-033058    2/2006

* cited by examiner

*Primary Examiner* — Daniel D Chang
(74) *Attorney, Agent, or Firm* — Michael Best & Friedrich LLP

(57) ABSTRACT

A clock tree unit cell circuit includes a first input terminal configured to receive a clock signal from an upstream side of a clock tree; a first output terminal configured to output a clock signal to a downstream side of the clock tree; a second input terminal configured to receive a standby signal from the upstream side of the clock tree; a third input terminal configured to receive a standby signal from the downstream side of the clock tree; a logic circuit configured to perform a predetermined logical operation on the clock signal inputted to the first input terminal and output the clock signal to the first output terminal; and a control circuit that is connected to the second input terminal, the third input terminal, and an output control terminal of the logic circuit.

17 Claims, 7 Drawing Sheets

CLOCK TREE UNIT CELL CIRCUIT, CLOCK TREE, AND APPARATUS

CROSS REFERENCE TO RELATED APPLICATIONS

This application claims the benefit of priority under 35 U.S.C. §119 from Japanese Priority Patent Application JP 2014-062644 filed Mar. 25, 2014, the entire contents of each which is incorporated herein by reference.

BACKGROUND

The present technology relates to a clock tree unit cell circuit, a clock tree, and an apparatus.

From the past, a clock tree formed by connecting a plurality of inverters in cascade has been widely used in a semiconductor circuit. In such a clock tree, each of the inverters successively propagates a clock signal in a subsequent stage with a predetermined output delay time. The clock signal through which any appropriate connection point of a plurality of connection points formed between the plurality of inverters is propagated is obtained as a clock signal supplied to other circuits.

However, during a period where the clock signal is not supplied to the clock tree, a different logic state persists between the inverters in odd-number stages and the inverters in even-number stages, thereby generating a difference in a degree of deterioration of a transistor between the inverters in odd-number stages and the inverters in even-number stages. Therefore, when supply of the clock signal to the clock tree is resumed, the output delay time is different between the inverters in odd-number stages and the inverters in even-number stages.

This may result in changing (degrading) a duty ratio of the clock signal passing through the clock tree. Further, large deterioration of the transistor, a long clock tree, and a high clock frequency may cause a largely varied duty ratio and lose the clock signal itself.

In view of the above circumstances, Japanese Patent Application Laid-open No. 2006-33058 (hereinafter, referred to as Patent Document 1) discloses a clock tree using NAND instead of an inverter.

The technology disclosed in Patent Document 1 has a configuration so that a standby signal is inputted to the NAND at standby and has a merit that an inversion layer is not formed in MOS at standby to which a clock signal is inputted. Therefore, deterioration of the transistor, which is called negative bias temperature instability (NBTI) and positive bias temperature instability (PBTI), can be prevented.

SUMMARY

The technology disclosed in Patent Document 1 is effective in cases where the standby signal is considered to be simultaneously inputted to all NANDs. However, a clock tree length is long (for example, around 10 nm) and a signal propagation delay occurs, which causes a glitch in the clock signal due to variation in timing to release each NAND from standby. Moreover, when the standby signal is applied, the glitch may also occur. Such a glitch is applied to a clock input of a storage circuit (such as D-Flip Flop) in a subsequent stage, which causes the circuit to malfunction.

A standby period of the storage circuit in the subsequent stage is set to be longer than a standby period of the clock tree, which allows for preventing malfunction. This case allows the clock tree to be standby during only a reset period of the storage circuit in the subsequent stage, thereby limiting the effectiveness of an operation for preventing deterioration. Moreover, a sequencer is necessary, so that a circuit scale increases.

The present technology has been made in view of the above problems, and it is desirable to provide a clock tree unit cell circuit, a clock tree, and an apparatus that are capable of effectively preventing deterioration of the clock in the clock tree.

According to an embodiment of the present technology, there is provided a clock tree unit cell circuit including a first input terminal configured to receive a clock signal from an upstream side of a clock tree; a first output terminal configured to output a clock signal to a downstream side of the clock tree; a second input terminal configured to receive a standby signal from the upstream side of the clock tree; a third input terminal configured to receive a standby signal from the downstream side of the clock tree; a logic circuit configured to perform a predetermined logical operation on the clock signal inputted to the first input terminal and output the clock signal to the first output terminal; and a control circuit that is connected to the second input terminal, the third input terminal, and an output control terminal of the logic circuit.

According to another embodiment of the present technology, there is provided a clock tree including a circuit including a first input terminal configured to receive a clock signal from an upstream side of the clock tree, a first output terminal configured to output a clock signal to a downstream side of the clock tree, a second input terminal configured to receive a standby signal from the upstream side of the clock tree, a second output terminal configured to output the standby signal inputted to the second input terminal to the downstream side of the clock tree, a third input terminal configured to receive a standby signal from the downstream side of the clock tree, a third output terminal configured to output the standby signal inputted to the third input terminal to the upstream side of the clock tree, a logic circuit configured to output, to the first output terminal, a clock signal generated by performing a predetermined logical operation on the clock signal inputted to the first input terminal, and a control circuit that is connected to the second input terminal, the third input terminal, and an output control terminal of the logic circuit, the circuits including the first output terminal that is connected to the first input terminal of the circuit on the downstream side, the second output terminal that is connected to the second input terminal of the circuit on the downstream side, and the third input terminal that is connected to the third output terminal of the circuit on the downstream side, the second output terminal of the circuit in a final stage being connected to the third input terminal of the circuit in the final stage.

Another embodiment of the present technology, there is provided an apparatus including the clock tree that is formed across a plurality of semiconductor devices.

The clock tree unit cell circuit, the clock tree, or the apparatus described above include various embodiments where they are implemented in a state of being incorporated into any other apparatuses or in combination with any other methods.

An embodiment of the present technology, it is possible to effectively prevent deterioration of the clock in the clock tree. It should be noted that the effects described in the present specification are merely exemplary and not limited, and may have additional effects.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments of the present technology will be described with reference to the drawings.

(1) First Embodiment

Figure 1:
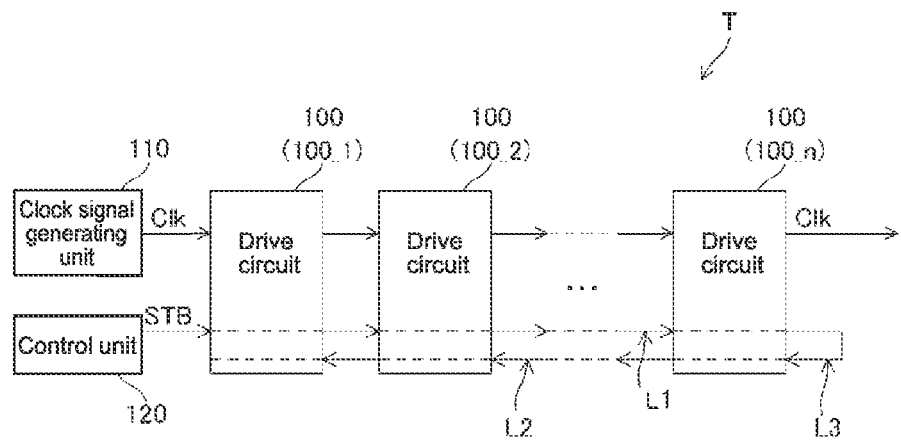
FIG. 1 is a diagram describing a schematic configuration of a clock tree according to a first embodiment.

FIG. 1 is a diagram describing a schematic configuration of a clock tree T according to a first embodiment.

The clock tree T according to the present embodiment can be applied to various semiconductor devices in general and is applied suitably to a large scale integrated circuit (LSI) of applications necessary for high-speed processing in particular. More specifically, examples of such applications include an image processing LSI, an image capturing LSI, a communication LSI, a data processing LSI. Further specifically, examples of such applications include a video camera, a digital camera, a television, a game apparatus, a medical apparatus, a personal computer, an automobile, and an aircraft.

The clock tree T shown in FIG. 1 has a configuration formed by connecting in cascade a plurality of drive circuits 100_1 to 100_n (n is a natural number) having an output delay time for propagation of clock signals. The drive circuits have a predetermined output delay time $\Delta t0$ from input to output of the clock signals.

The drive circuit 100_1 in a first stage of the clock tree T receives a clock signal Clk from an external clock signal generating unit 110. It should be noted that the clock signal Clk to be inputted to the first stage of the clock tree T is fixed to positive logic H (in a case where a logic circuit 10 is constituted of a NAND circuit (described later)) or negative logic L (in a case where the logic circuit 10 is constituted of a NOR circuit (described later)) at standby. It should be noted that "at standby" referred herein indicates a period where an external control unit 120 including a standby transition period (described later) inputs a standby signal STB to the clock tree T.

Therefore, a logic state of the clock signal outputted by the drive circuit 100_1 in the first stage is set to the negative logic L during a period from a start of inputting the standby signal STB to the clock tree T by the external control unit 120 until the drive circuit 100_1 actually transits to a standby state (hereinafter described as "standby transition period"). Moreover, a logic state of the clock signal outputted by the drive circuit 100_2 in a second stage is set to the positive logic H during a standby transition period. That is, during the standby transition period, output in odd-number stages of the clock tree T is set to the negative logic L, and output in even-number stages of the clock tree T is set to the positive logic H.

The clock signal Clk supplied to the drive circuit 100_1 is successively propagated through the plurality of drive circuits 100_1 to 100_n connected in cascade and is externally outputted from the drive circuit 100_n in a final stage. It is obvious that the clock signal may be externally outputted from connection nodes of the plurality of drive circuits 100_1 to 100_n.

The clock tree T has a first propagation path L1 and a second propagation path L2 formed by linking internal wirings of the plurality of drive circuits 100_1 to 100_n connected in cascade together, as a propagation path of the standby signal STB. It should be noted that hereinafter the first propagation path L1 may be called as "approach route", and the second propagation path L2 may be called as "return route".

The first propagation path L1 is a propagation path for propagating the standby signal STB from an upstream to a downstream of the clock tree T (in order of drive circuits 100_1, 100_2, ... 100_n). The second propagation path L2 is a propagation path for propagating the standby signal STB from the downstream to the upstream of the clock tree T (in order of drive circuits 100_1, 100_2, and 100_1). The first propagation path L1 and the second propagation path L2 are connected by a return portion L3 in a final stage of the clock tree T.

A starting end of the first propagation path L1 receives the standby signal STB from the external control unit 120 of the clock tree T at a suitable timing. This standby signal STB propagates through the first propagation path L1 from the upstream to the downstream of the clock tree T, reaches the drive circuit 100_n in the final stage, is inputted to a terminal end of the second propagation path L2 through the return portion L3, propagates through the second propagation path L2 from the downstream to the upstream of the clock tree T, and returns the starting end of the second propagation path L2.

At this time, only after receiving the standby signal STB together with the first propagation path L1 and the second propagation path L2, a standby control circuit 20 changes a logic state of a control signal Ctl to a logic state for instructing a standby state. Accordingly, in order of propagating the standby signal STB through the second propagation path L2, the logic circuit 10 of each drive circuit is controlled to a standby state. Therefore, it is possible to prevent the clock signal Clk that a glitch occurs from being externally outputted to the clock tree T.

Meanwhile, when the standby signal STB is not inputted to at least one of the first propagation path L1 and the second propagation path L2, the standby control circuit 20 changes the logic state of the control signal Ctl to a logic state for releasing the standby state. Accordingly, in order of propagating the standby signal STB through the first propagation path L1, the standby state of the logic circuit 10 of each drive circuit is released. Therefore, the glitch does not occur in the clock signal Clk externally outputted without externally providing a sequencer to the clock tree T.

It should be noted that FIG. 1 shows an example of the clock tree T having the plurality of drive circuits 100_1 to 100_n arranged in line, but the clock tree T is not limited to this configuration. It may take various embodiments such as an H-tree model, a binary tree model, a fan-out balance tree model, and a fishbone model as long as an equal-length wiring and an equal-load wiring are employed.

[Configuration of Drive Circuit]

Figure 2:
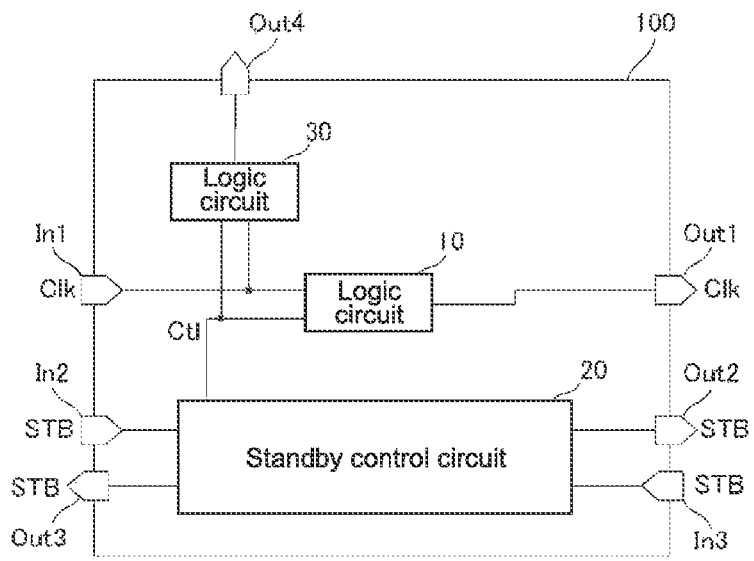
FIG. 2 is a diagram describing a configuration of a drive circuit.

FIG. 2 is a diagram describing a configuration of the drive circuit 100 as a unit cell circuit constituting the clock tree T.

The drive circuit 100 shown in FIG. 2 mainly includes the logic circuit 10 and the standby control circuit 20 and has, as input/output terminals, a first input terminal In1 for receiving the clock signal Clk, a first output terminal Out1 for outputting the clock signal Clk, a second input terminal In2 for receiving the standby signal STB, a second output terminal Out2 for outputting the standby signal STB, a third input terminal In3 for receiving the standby signal, and a third output terminal Out3 for outputting the standby signal.

[Logic Circuit]

In the logic circuit 10, one input terminal is connected to the first input terminal In1, the other input terminal is connected to the standby control circuit 20, and an output terminal is connected to the first output terminal Out1. In the present embodiment, the input terminal connected to the standby control circuit 20 corresponds to an output control circuit of the logic circuit 10.

The logic circuit 10 outputs, from the first output terminal Out1, a signal obtained by performing a predetermined logical operation on the clock signal Clk inputted from the first input terminal In1. The following embodiment describes a logically inverted case as an example of the logical operation. It should be noted that the present specification uses the same reference symbol of Clk to describe the clock signal logically inverted unless particularly necessary.

Upon receiving the control signal Ctl from the standby control circuit 20, the logic circuit 10 outputs a signal in a logic state (the positive logic H or the negative logic L) which is the same as that of the signal inputted to the first input terminal In1 at standby from the first output terminal Out1. That is, upon receiving the control signal Ctl, the logic circuit 10 has a logic state matched between the input terminal and the output terminal connected to the first input terminal In1.

[Standby Control Circuit]

The standby control circuit 20 instructs a standby to the logic circuit 10 while the standby signal STB is inputted to the second input terminal In2 and the standby signal STB is inputted to the third input terminal In3. Specifically, the control signal Ctl inputted to the logic circuit 10 is set to a logic state for instructing the standby.

Meanwhile, unless one of the second input terminal In2 and the third input terminal In3 receives the standby signal STB, the standby control circuit 20 does not instruct the standby to the logic circuit 10. Specifically, the control signal Ctl inputted to the logic circuit 10 is set to a logic state where the standby is not instructed.

Moreover, the standby control circuit 20 delays the standby signal STB inputted from the second input terminal In2 by a predetermined time $\Delta t1$ and outputs it to the second output terminal Out2, and delays the standby signal STB inputted from third input terminal In3 by a predetermined time $\Delta t2$ and outputs it from the third output terminal Out3.

Consequently, the standby signal STB inputted from the second input terminal In2 is outputted to a subsequent stage with a delay of $\Delta t1$ from the input to the drive circuit 100, and the standby signal STB inputted from the third input terminal In3 is outputted to a preceding stage with a delay of $\Delta t2$ from the input to the drive circuit 100.

It should be noted that the output delay time $\Delta t1$ is set to be desirably longer than the output delay time $\Delta t2$. Moreover, the output delay time $\Delta t1$ is set to be longer than the output delay time $\Delta t0$ that the drive circuit 100 described above has on the clock signal (the output delay time $\Delta t0$ that the logic circuit 10 has). Consequently, each drive circuit releases the standby after releasing the fixing of the logic state of the clock signal Clk inputted, which makes it possible to prevent a glitch from occurring in the clock signal Clk.

[In the Case of NAND]

Figure 3:
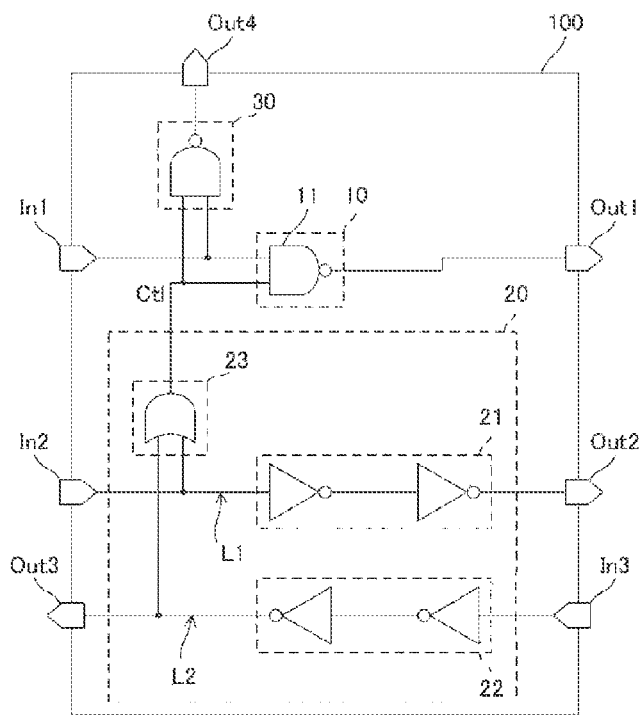
FIG. 3 is a diagram describing an example of a specific configuration of the drive circuit.

FIG. 3 is a diagram describing an example of a specific configuration of the drive circuit 100. It should be noted that the drive circuit 100 shown in FIG. 3 allows the clock signal generating unit 110 to fix the clock signal Clk to the positive logic H at a timing when the control unit 120 starts input to the clock tree T of the standby signal STB.

In FIG. 3, the logic circuit 10 is constituted of a NAND circuit 11. If not instructing the standby to the NAND circuit 11 as the control signal Ctl inputted to the NAND circuit 11, the standby control circuit 20 outputs the positive logic H. If instructing the standby to the NAND circuit 11, the standby control circuit 20 outputs the negative logic L.

Therefore, while receiving the positive logic H from the standby control circuit 20, the NAND circuit 11 outputs a signal in which the inputted clock signal Clk is logically inverted. At this time, the logic state of the clock signal Clk to be inputted is fixed to the positive logic H, so that the NAND circuit 11 outputs the negative logic L.

Meanwhile, while receiving the negative logic L from the standby control circuit 20, the NAND circuit 11 outputs a signal in a logic state which is the same as that of the inputted clock signal Clk. At this time, the logic state of the clock signal Clk to be inputted is fixed to the positive logic H, so that the NAND circuit 11 outputs the positive logic H.

[In the Case of NOR]

Figure 4:
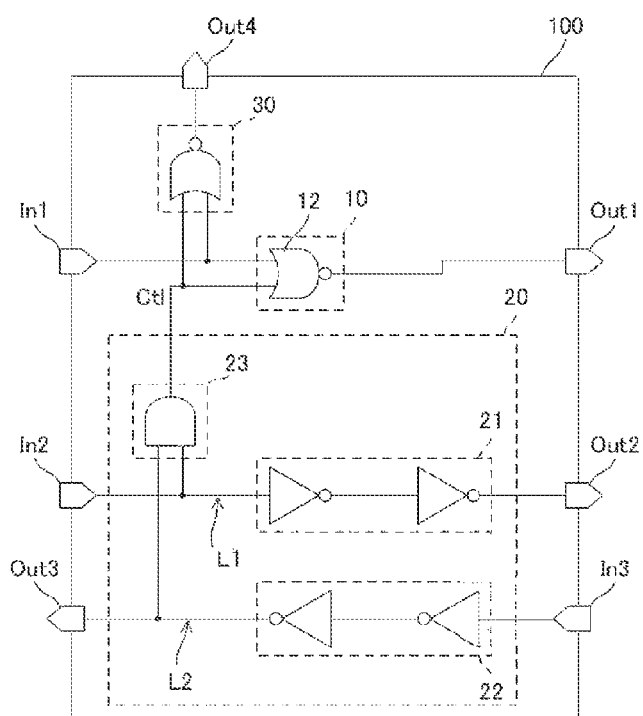
FIG. 4 is a diagram describing an example of a specific configuration of the drive circuit.

FIG. 4 is a diagram describing an example of a specific configuration of the drive circuit 100. It should be noted that the drive circuit 100 shown in FIG. 4 allows the clock signal generating unit 110 to fix the clock signal Clk to the negative logic L at a timing when the control unit 120 starts input to the clock tree T of the standby signal STB.

In FIG. 4, the logic circuit 10 is constituted of a NOR circuit 12. If not instructing the standby to the NOR circuit 12 as the control signal Ctl inputted to the NOR circuit 12, the standby control circuit 20 outputs the negative logic L. If instructing the standby to the NOR circuit 12, the standby control circuit 20 outputs the positive logic H.

Therefore, while receiving the negative logic L from the standby control circuit 20, the NOR circuit 12 outputs a signal in which the inputted clock signal Clk is logically inverted. At this time, the logic state of the clock signal Clk to be inputted is fixed to the negative logic L, so that the NOR circuit 12 outputs the positive logic H.

Meanwhile, while receiving the positive logic H from the standby control circuit 20, the NOR circuit 12 outputs a signal in a logic state which is the same as that of the inputted clock signal Clk. At this time, the logic state of the clock signal Clk to be inputted is fixed to the negative logic L, so that the NOR circuit 12 outputs the negative logic L.

[AND Circuit, Inverter]

The standby control circuit 20 shown in FIGS. 3 and 4 includes a delay circuit 21 as a first delay circuit having the output delay time $\Delta t1$, a delay circuit 22 as a second delay circuit having the output delay time $\Delta t2$, and a logic circuit 23.

The delay circuits 21 and 22 can be constituted of two inverters connected in series, for example.

The delay circuit 21 is disposed on a path connecting the second input terminal In2 and the second output terminal Out2. The delay circuit 21 delays the standby signal STB inputted from the second input terminal In2 by the output delay time Δt1 and outputs it to the second output terminal Out2.

The delay circuit 22 is disposed on a path connecting the third input terminal In3 and the third output terminal Out3. The delay circuit 22 delays the standby signal STB inputted from the third input terminal In3 by the output delay time Δt2 and outputs it from the third output terminal Out3.

In the logic circuit 23, one input terminal is connected to a path connecting between the second input terminal In2 and the second output terminal Out2, the other input terminal is connected to a path connecting between the third input terminal In3 and the third output terminal Out3, and an output terminal is connected to one input terminal of the logic circuit 10.

It should be noted that the examples shown in FIGS. 3 and 4 show each input terminal of the logic circuit 23 is connected to the first propagation path L1 and the second propagation path L2 in a position rather near to a preceding stage of the delay circuit. However, the position connecting the first propagation path L1 and the second propagation path L2 of each input terminal of the logic circuit 23 is not limited to this. It may be connected in a position rather near to a subsequent stage of the delay circuit.

[Logic Circuit 23 is OR Circuit]

When the logic circuit 10 described above is constituted of the NAND circuit 11 as shown in FIG. 3, the logic circuit 23 is constituted of an OR circuit. At this time, the standby signal STB for instructing a standby state is constituted of the negative logic L, so that the first propagation path L1 and the second propagation path L2 are set to the positive logic H only when propagating the standby signal STB and are maintained at the positive logic H when not propagating the standby signal STB.

If at least one of the logic states of the signals inputted to the second input terminal In2 and the third input terminal In3 is not set to the negative logic L when the logic circuit 23 is constituted of the OR circuit, the positive logic H is outputted from an output terminal of the OR circuit to an input terminal of the logic circuit 10.

Meanwhile, if both of the logic states of the signals inputted to the second input terminal In2 and the third input terminal In3 are set to the negative logic L (both of the first propagation path L1 and the second propagation path L2 in the drive circuit 100 are set to the negative logic L), the negative logic L is outputted from the output terminal of the OR circuit to the input terminal of the logic circuit 10.

At this time, output of the NAND circuit 11 is set to the positive logic H, and the logic states of the first input terminal In1 and the first output terminal Out1 are maintained at the same positive logic H. Consequently, each drive circuit constituting the clock tree T takes the same logic state. As a result, it is possible to prevent deterioration of a transistor between the drive circuits in odd-number stages and the drive circuits in even-number stages constituting the clock tree T.

[Constitution of Logic Circuit 23 by AND]

When the logic circuit 10 described above is constituted of the NOR circuit 12 as shown in FIG. 4, the logic circuit 23 is constituted of an AND circuit. At this time, the standby signal STB for instructing a standby state is constituted of the positive logic H, so that the first propagation path L1 and the second propagation path L2 are set to the positive logic H only when propagating the standby signal STB and are maintained at the negative logic L when not propagating the standby signal STB.

If at least one of the logic states of the signals inputted to the second input terminal In2 and the third input terminal In3 is not set to the positive logic H when the logic circuit 23 is constituted of the AND circuit, the negative logic L is outputted from an output terminal of the AND circuit to the input terminal of the logic circuit 10.

Meanwhile, if both of the logic states of the signals inputted to the second input terminal In2 and the third input terminal In3 are set to the positive logic H (both of the first propagation path L1 and the second propagation path L2 in the drive circuit 100 are set to the positive logic H), the positive logic H is outputted from the output terminal of the AND circuit to the input terminal of the logic circuit 10.

At this time, output of the NOR circuit 12 is set to the negative logic L, and the logic states of the first input terminal In1 and the first output terminal Out1 are maintained at the same negative logic L. Consequently, each drive circuit constituting the clock tree T takes the same logic state. As a result, it is possible to prevent deterioration of a transistor between the drive circuits in odd-number stages and the drive circuits in even-number stages constituting the clock tree T.

[NAND for Clock Extract]

Furthermore, the drive circuit 100 includes a logic circuit 30 for clock extract and a fourth output terminal Out4. The logic circuit 30 is a logic circuit which is the same as the logic circuit 10 described above. Each input terminal is connected to each input terminal of the logic circuit 10 and an output terminal is connected to the fourth output terminal Out4.

Consequently, a clock of the logic state which is the same as that of the first output terminal Out1 described above is outputted to the fourth output terminal Out4. This fourth output terminal Out4 is connected to a target circuit to which the clock is supplied from the clock tree T as necessary and can supply the clock signal to the target circuit.

It should be noted that the logic circuit 30 for clock extract and the fourth output terminal Out4 may be provided with all drive circuits 100 constituting the clock tree T. More desirably, they are provided with wirings which are not logically inverted between a standby state and a standby releasing state.

For example, when the clock signal inputted to the drive circuit 100 constituting the first stage of the clock tree T at the standby state is set to the positive logic H, output of the drive circuits 100 in even-number stages has the same logic state of the positive logic H between the standby setting state and the standby releasing state.

Accordingly, when the extracted clock signal is inputted to a state holding circuit (such as DFF), the clock signal outputted by the drive circuits 100 in even-number stages is used to absolutely eliminate the need to generate a status change obtained by causing the state holding circuit to change the clock tree to a standby state. Therefore, a period where the standby of the clock tree can be performed is significantly expanded in comparison to the related art. That is, a degree of flexibility in setting can be improved.

(2) Second Embodiment

Figure 5:
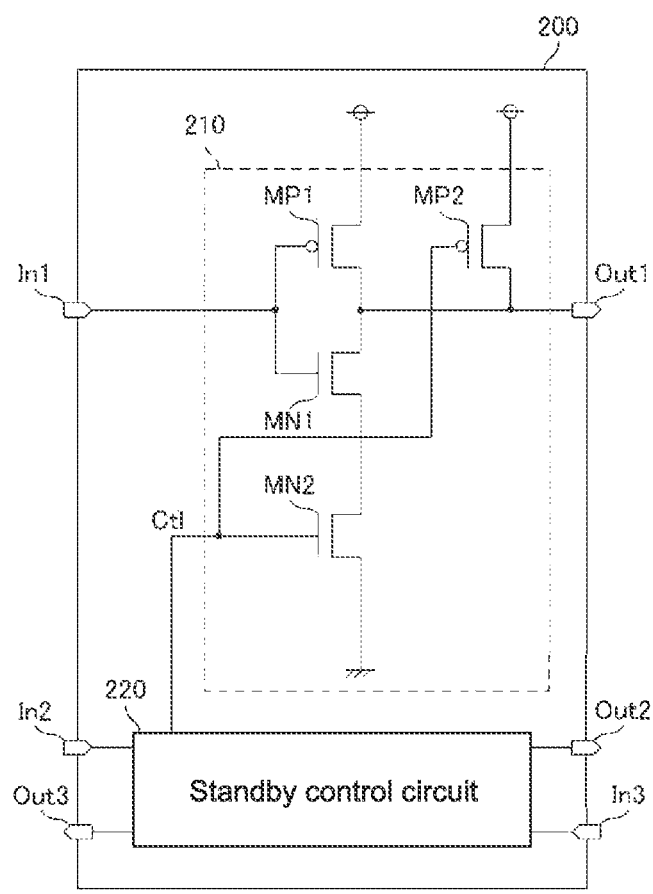
FIG. 5 is a diagram describing an embodiment in which a logic circuit is configured of a NAND circuit.

FIG. 5 is a diagram describing an embodiment in which a logic circuit is specifically configured of a NAND circuit.

A drive circuit 200 shown in FIG. 5 includes a NAND circuit 210 and a standby control circuit 220. It should be noted that the standby control circuit 220 has the same configuration as that of the standby control circuit 20 described above. Therefore, a detailed description thereof will be omitted hereinafter.

The NAND circuit 210 includes a negative channel metal oxide semiconductor (NMOS) transistor MN1 as a first NMOS transistor, an NMOS transistor MN2 as a second NMOS transistor, a positive channel metal oxide semiconductor (PMOS) transistor MP1 as a first PMOS transistor, and a PMOS transistor MP2 as a second PMOS transistor.

The PMOS transistor MP1, the NMOS transistor MN1, and the NMOS transistor MN2 are connected in cascode in this sequence between a predetermined constant voltage source and a ground.

The gates of the NMOS transistor MN1 and the PMOS transistor MP1 are connected to the first input terminal In1, and connection nodes of a drain of the NMOS transistor MN1 and a drain of the PMOS transistor MP1 are connected to the first output terminal Out1. Therefore, the NMOS transistor MN1 and the PMOS transistor MP1 function as inverters for inverting and outputting a signal inputted from the first input terminal In1 to the first output terminal Out1.

The NMOS transistor MN2 is connected between a source and the ground of the NMOS transistor MN1, and the control signal Clt is inputted to the gate from the standby control circuit 220. When the control signal Clt is set to the positive logic H, the NMOS transistor MN2 is turned on and becomes an on-resistance between the source and the ground of the NMOS transistor MN1. When the control signal Clt is set to the negative logic L, the NMOS transistor MN2 is turned off and disconnects the source of the NMOS transistor MN1 from the ground.

The PMOS transistor MP2 is connected by drain and source between a predetermined constant voltage source and the first output terminal Out1, and the control signal Clt is inputted to the gate from the standby control circuit 220. When the control signal Clt is set to the positive logic H, the PMOS transistor MP2 is turned off and becomes a parasitic capacitance for disconnecting the first output terminal Out1 from the constant voltage source. When the control signal Clt is set to the negative logic L, the PMOS transistor MP2 is turned on and pulls the first output terminal Out1 up to a voltage of the constant voltage source.

During releasing the standby, the control signal Clt outputted by the standby control circuit 220 is set to the positive logic H, so that the NMOS transistor MN2 is fully turned and the PMOS transistor MP2 is turned off. Therefore, a signal obtained by inverting the clock signal Clk inputted to the first input terminal In1 is outputted from the first output terminal Out1.

During the standby operation, the control signal Clt outputted by the standby control circuit 220 is set to the negative logic L and logic of the clock signal Clk to be inputted to the first input terminal In1 is fixed to the positive logic H, so that the NMOS transistor MN2 is turned off and the PMOS transistor MP2 is turned on. Therefore, the positive logic H is outputted from the first output terminal Out1.

Thus, during the standby operation, all of the source, the drain, and the gate of the PMOS transistor MP1 are set to equal potential states of the positive logic H, and the PMOS transistor MP1 is set to a state where bias (electric field) is not applied to an element, that is, a state where a channel is not formed. Therefore, the PMOS transistor MP1 has neither negative bias temperature instability (NBTI) during the standby operation nor deterioration of the transistor by the NBTI.

Incidentally, the NMOS transistor MN2 functions as the on-resistance between the NMOS transistor MN1 and the ground as described above during releasing the standby, so that it is desirable that its on-resistance be negligibly small as compared to the on-resistance of the NMOS transistor MN1. That is, it is desirable that a size of the NMOS transistor MN2 be larger than that of at least the NMOS transistor MN1 and the PMOS transistor MP1.

Since the size of the transistor is thus adjusted, it is possible to prevent increase in a transition time of the clock signal Clk caused by connecting the NMOS transistor MN2 in cascode to the NMOS transistor MN1 and the PMOS transistor MP1.

Meanwhile, since the PMOS transistor MP2 functions as the parasitic capacitance between the predetermined constant voltage source and the first output terminal Out1 as described above during releasing the standby, it is desirable that its capacitance decrease as much as possible. That is, it is desirable that a size of the PMOS transistor MP2 be smaller than that of at least the PMOS transistor MP1 and the NMOS transistor MN1.

(3) Third Embodiment

Figure 6:
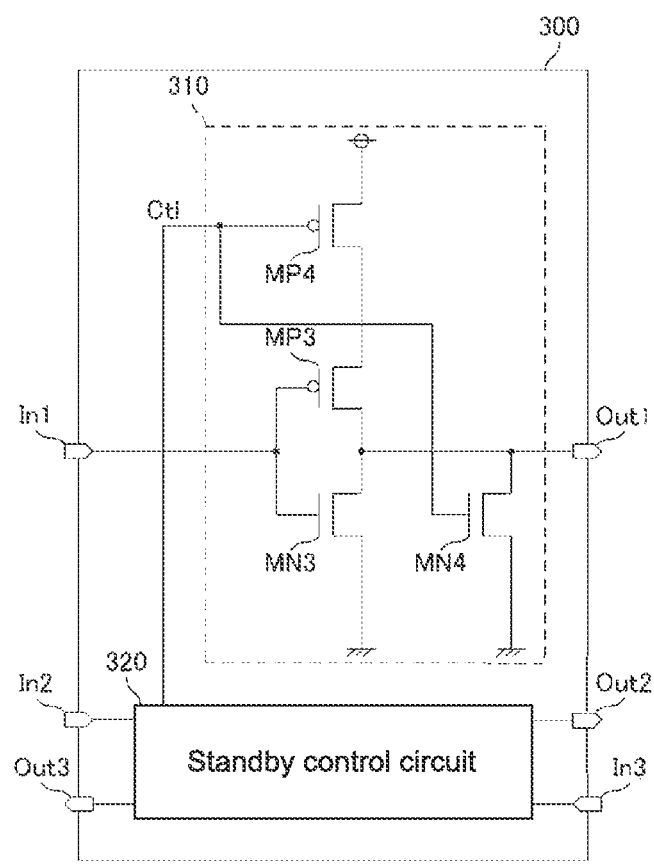
FIG. 6 is a diagram describing an embodiment in which the logic circuit is configured of a NOR circuit.

FIG. 6 is a diagram describing an embodiment in which the logic circuit is configured of the NOR circuit.

A drive circuit 300 shown in FIG. 6 includes a NOR circuit 310 and a standby control circuit 320. It should be noted that the standby control circuit 320 has the same configuration as that of the standby control circuit 20 described above. Therefore, a detailed description thereof will be omitted hereinafter.

The NOR circuit 310 includes a negative channel metal oxide semiconductor (NMOS) transistor MN3 as a third NMOS transistor, an NMOS transistor MN4 as a fourth NMOS transistor, a positive channel metal oxide semiconductor (PMOS) transistor MP3 as a third PMOS transistor, and a PMOS transistor MP4 as a fourth PMOS transistor.

The PMOS transistor MP4, the PMOS transistor MP3, and the NMOS transistor MN3 are connected in cascode in the stated order between a predetermined constant voltage source and a ground.

Gates of the NMOS transistor MN3 and the PMOS transistor MP3 are connected to the first input terminal In1, and connection nodes of a drain of the NMOS transistor MN3 and a drain of the PMOS transistor MP3 are connected to the first output terminal Out1. Therefore, the NMOS transistor MN3 and the PMOS transistor MP3 function as inverters for inverting and outputting a signal inputted from the first input terminal In1 to the first output terminal Out1.

The PMOS transistor MP4 is connected between the predetermined constant voltage source and the drain of the PMOS transistor MP3, and the control signal Clt is inputted to the gate from the standby control circuit 320. When the control signal Clt is set to the negative logic L, the PMOS transistor MP4 is turned on and becomes an on-resistance between the predetermined constant voltage source and the drain of the PMOS transistor MP3. When the control signal Clt is set to the positive logic H, the PMOS transistor MP4 is turned off and disconnects the PMOS transistor MP3 from the predetermined constant voltage source.

The NMOS transistor MN4 is connected between the first output terminal Out1 and the ground, and the control signal Clt is inputted to the gate from the standby control circuit 320. When the control signal Clt is set to the negative logic L, the NMOS transistor MN4 is turned off and disconnects the first output terminal Out1 from the ground. When the control signal Clt is set to the positive logic H, the NMOS transistor MN4 is turned on and functions as the parasitic capacitance for pulling the first output terminal Out1 down to the ground.

During releasing the standby, the control signal Clt outputted by the standby control circuit 320 is set to the negative logic L, so that the PMOS transistor MP4 is fully turned on and the NMOS transistor MN4 is turned off. Therefore, a signal obtained by inverting the clock signal Clk inputted to the first input terminal In1 is outputted from the first output terminal Out1.

During the standby operation, the control signal Clt outputted by the standby control circuit 320 is set to the positive logic H and logic of the clock signal Clk to be inputted to the first input terminal In1 is fixed to the negative logic L, so that the PMOS transistor MP4 is turned off and the NMOS transistor MN4 is turned on. Therefore, the negative logic L is outputted from the first output terminal Out1.

Thus, during the standby operation, all of the source, the drain, and the gate of the NMOS transistor MN3 are set to equal potential states of the negative logic L, and the NMOS transistor MN3 is set to a state where bias (electric field) is not applied to an element, that is, a state where a channel is not formed. Therefore, the NMOS transistor MN3 has neither positive bias temperature instability (PBTI) during the standby operation nor deterioration of the transistor by the PBTI.

Incidentally, the PMOS transistor MP4 functions as the on-resistance between the predetermined constant voltage source and the drain of the PMOS transistor MP3 as described above during releasing the standby, so that it is desirable that its on-resistance be negligibly small as compared to the on-resistance of the PMOS transistor MP3. That is, it is desirable that a size of the PMOS transistor MP4 be larger than that of at least the PMOS transistor MP3 and the NMOS transistor MN3.

Since the size of the transistor is thus adjusted, it is possible to prevent increase in a transition time of the clock signal Clk caused by connecting the PMOS transistor MP4 in cascode to the PMOS transistor MP3 and the NMOS transistor MN3.

Meanwhile, since the PMOS transistor MP4 functions as the parasitic capacitance between the first output terminal Out1 and the ground as described above during releasing the standby, it is desirable that its capacitance decrease as much as possible. That is, it is desirable that a size of the PMOS transistor MP4 be smaller than that of at least the NMOS transistor MN3 and the PMOS transistor MP31.

(4) Fourth Embodiment

Figure 7:
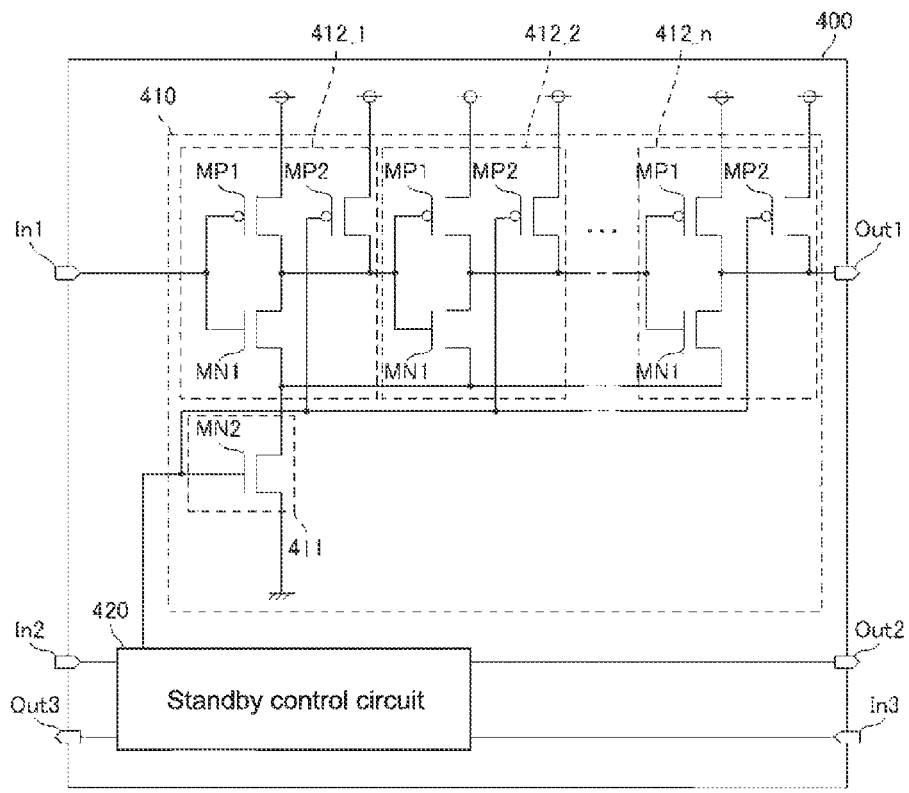
FIG. 7 is a diagram describing an embodiment in which a power gate element is shared by a plurality of drive circuits constituting the clock tree.

FIG. 7 is a diagram describing the present embodiment in which a power gate element is shared by a plurality of drive circuits constituting the clock tree T.

A drive circuit 400 shown in FIG. 7 includes a logic circuit 410 and a standby control circuit 420. It should be noted that the standby control circuit 420 has the same configuration as that of the standby control circuit 20 described above. Therefore, a detailed description thereof will be omitted hereinafter.

The logic circuit 410 has a plurality of configurations which are the same as the logic circuits 10 as described above. The logic circuit 410 is configured such that a power gate unit of the plurality of logic circuits 10, that is, the NMOS transistor MN2 is shared by the plurality of logic circuits 10. Hereinafter, the shared NMOS transistor MN2 is used as a power gate unit 411, and the rest of the logic circuits 10 is used as inverter units 412_1, 412_2, . . . , 412_n.

That is, when the power gate unit 411 is turned on, each low potential side end of the inverter units 412_1, 412_2, . . . , 412_n becomes a so-called common virtual ground connected to a ground through an on-resistance of the power gate unit 411. Since the power gate unit 411 is thus shared, it is possible to reduce a circuit area of the power gate unit 411.

It should be noted that a few of signals are transited in the plurality of drive circuits constituting the tree T. The signal is not transited in many other drive circuits. Then, the inverter in the logic circuit is necessary to supply a current only at the signal transition, but is not necessary to supply the current at the non-signal transition. Accordingly, a signal propagation delay performance can be achieved as with the other embodiments as long as the clock tree T having n drive circuits includes the number of the power gate sizes corresponding to the number of elements for simultaneously supplying the voltage.

It should be noted that FIG. 7 shows an example of the circuit of the case where the power gate element of the logic circuit constituted of the above described NAND circuit is shared. However, it is obvious that the logic circuit constituted of the above described NOR circuit can also share the power gate element (the PMOS transistor MP4 shown in FIG. 6).

(5) Fifth Embodiment

Figure 8:
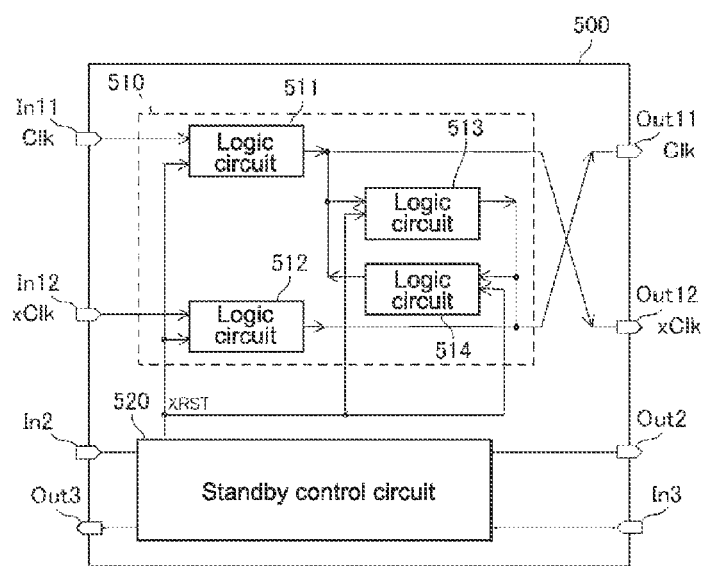
FIG. 8 is a diagram describing an embodiment according to a pseudo-differentiated drive circuit.

FIG. 8 is a diagram describing an embodiment according to a pseudo-differentiated drive circuit.

A drive circuit 500 shown in FIG. 8 is obtained by differentiating the drive circuit 100 described above and includes a logic circuit group 510 and a standby control circuit 520. It should be noted that the standby control circuit 520 has the same configuration as that of the standby control circuit 20 described above. Therefore, a detailed description thereof will be omitted hereinafter.

The drive circuit 500, which is pseudo-differentiated, receives a pair of positive and negative clock signal as input and outputs the pair of positive and negative clock signal. Therefore, instead of the first input terminal In1 and the first output terminal Out1 as input/output terminals of the clock signal, the drive circuit 500 includes a first positive phase input terminal In11 for receiving a positive phase clock signal Clk, a first negative phase input terminal In12 for receiving a negative phase clock signal xClk, a first positive phase output terminal Out11 for outputting the positive phase clock signal Clk, and a first negative phase input terminal Out12 for outputting the negative phase clock signal xClk.

The logic circuit group 510 has a logic circuit 511 to a logic circuit 514.

In the logic circuits 511, one input terminal is connected to the first positive phase input terminal In11, the other input terminal is connected to the standby control circuit 520, and an output terminal is connected to the first negative phase input terminal Out12. Therefore, the logic circuits 511 outputs, to the first negative phase input terminal Out12, a signal (the negative phase clock signal xClk) in which the positive phase clock signal Clk inputted from the first positive phase input terminal In11 is logically inverted.

In the logic circuit 512, one input terminal is connected to the first negative phase input terminal In12, the other input terminal is connected to the standby control circuit 520, and an output terminal is connected to the first positive phase output terminal Out11. Therefore, the logic circuits 512 outputs, to the first positive phase output terminal Out11, a signal (the positive phase clock signal Clk) in which the negative phase clock signal xClk inputted from the first negative phase input terminal In12 is logically inverted.

In the logic circuit 513, one input terminal is connected to an output terminal of the logic circuits 511, the other input terminal is connected to the standby control circuit 520, and an output terminal is connected to the first positive phase output terminal Out11. That is, the logic circuit 513 outputs, to the first positive phase output terminal Out11, a signal (the positive phase clock signal Clk) in which the signal (the negative phase clock signal xClk) outputted from the logic circuit 511 is further logically inverted. That is, the logic circuit 512 and the logic circuit 513 output the clock signals having the same phase.

In the logic circuit 514, one input terminal is connected to an output terminal of the logic circuits 512, the other input terminal is connected to the standby control circuit 520, and an output terminal is connected to the first negative phase input terminal Out12. That is, the logic circuit 514 outputs, to the first negative phase input terminal Out12, a signal (the negative phase clock signal xClk) in which the signal (the positive phase clock signal Clk) outputted from the logic circuit 512 is further logically inverted. That is, the logic circuit 511 and the logic circuit 514 output the clock signals having the same phase.

Figure 9:
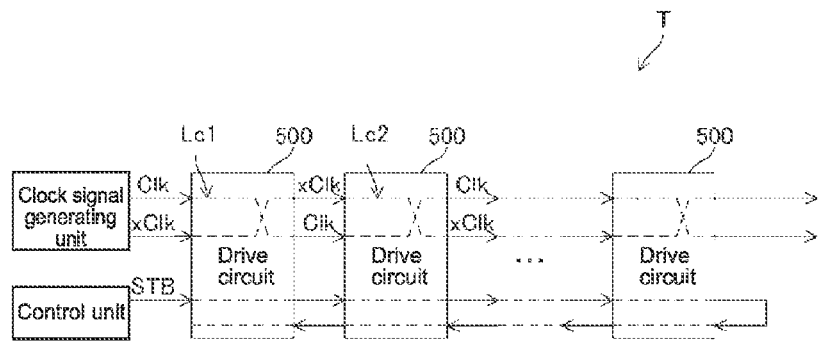
FIG. 9 is a diagram describing a clock tree constituted of the drive circuit shown in FIG. 8.

FIG. 9 is a diagram describing a clock tree T constituted of the drive circuit 500 shown in FIG. 8. The clock tree T shown in FIG. 9 includes two clock propagation paths Lc1 and Lc2 formed by connecting the plurality of drive circuits 500 in cascade. The positive phase clock signal Clk is inputted to a first stage of one clock propagation paths Lc1, and the negative phase clock signal xClk is inputted to a first stage of the other clock propagation paths Lc2. Each time passing through one drive circuit, these clock signals whose positive phase/negative phases are inverted are propagated to subsequent stages.

Herein, in the clock signal to be inputted to the first stage of the clock tree T at standby, the positive phase clock signal Clk is fixed to the positive logic H and the negative phase clock signal xClk is fixed to the negative logic L. Accordingly, with respect to the clock propagation paths Lc1, output of the drive circuits 500 in even-number stages is not logically inverted between the standby state and the standby releasing state, so that a clock signal suitable for input to a state holding circuit (such as DFF) is obtained. Meanwhile, with respect to the clock propagation path Lc2, output of the drive circuits 500 in odd-number stages is not logically inverted between the standby state and the standby releasing state, so that the clock signal suitable for input to the state holding circuit (such as DFF) is obtained.

As described above, the logic circuits in the drive circuits 500 are pseudo-differentiated, so that noise-resistant performance of the clock signal propagating through the clock tree T can be improved.

It should be noted that the drive circuits 500 according to the present embodiment may also share the power gate element among the plurality of the drive circuits 500 as with the fourth embodiment. That is, the power gate element may be shared among the plurality of the drive circuits 500 for each logic circuit constituting the drive circuits 500. Since the power gate element is thus shared, it is possible to reduce a circuit area of the power gate element.

(6) Sixth Embodiment

Figure 10:
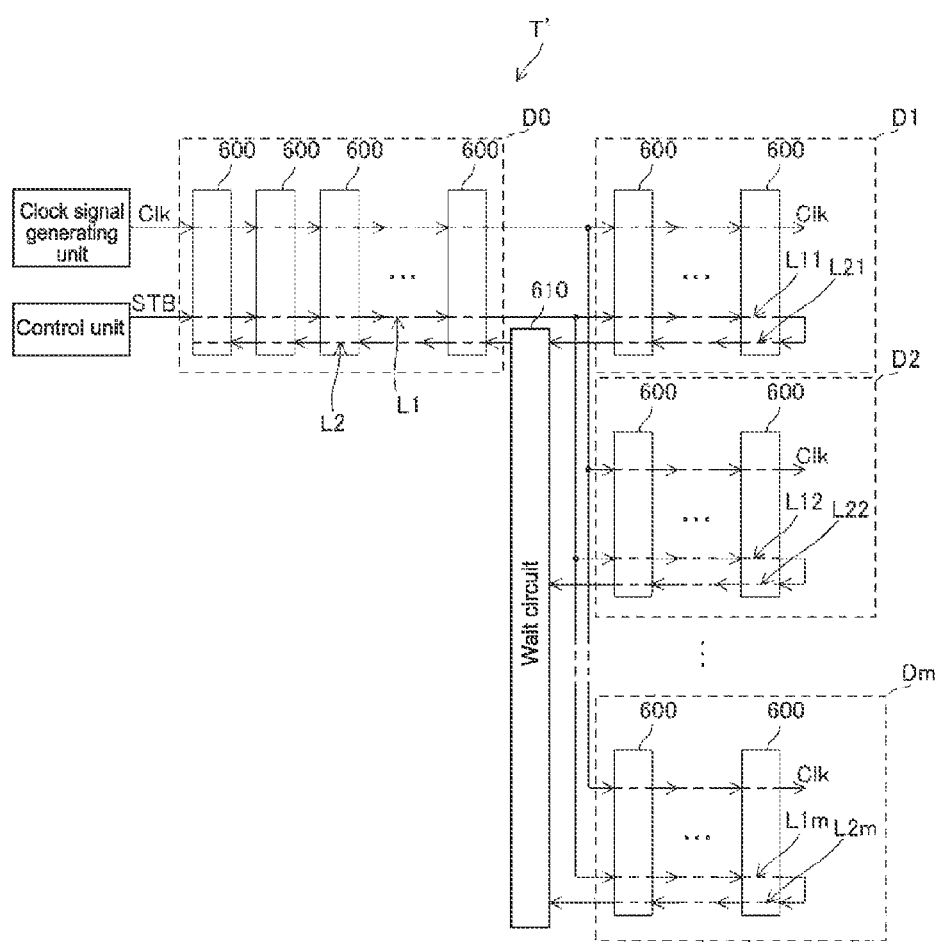
FIG. 10 is a diagram describing an embodiment according to a standby signal propagation at a clock tree having a branch at a midsection thereof.

FIG. 10 is a diagram describing an embodiment according to a standby signal propagation at a clock tree T' having a branch at a midsection thereof.

The clock tree T' shown in FIG. 10 includes drive circuit groups D0, D1 to Dm (m is a natural number) constituted by connecting a plurality of drive circuits 600 in cascade, and a wait circuit 610. Hereinafter, reference symbols of input/output terminals of the drive circuits will be described by using the reference symbols of the drive circuit 100 according to the first embodiment.

The clock tree T' is branched from a final stage of the drive circuit group D0 constituted by connecting the plurality of drive circuits 600 in cascade into the drive circuit groups D1 to Dm constituted by connecting the plurality of drive circuits 600 in cascade, and the third input terminal In3 of the drive circuit 500 at an immediately upstream of a branch point and the third output terminal Out3 of the drive circuit 600 at an immediately downstream of the branch point are connected through the wait circuit 610.

After successively propagating a clock signal propagation path in the drive circuit D0 to a subsequent stage, the clock signal Clk inputted to a first stage of the drive circuit D0 is inputted to a first stage of the drive circuit groups D1 to Dm. After successively propagating through the drive circuit groups D1 to Dm to the subsequent stage, the clock signal Clk inputted to the first stages of the drive circuit groups D1 to Dm is outputted from the final stages of the drive circuit groups D1 to Dm.

Meanwhile, after successively propagating the first propagation path L1 formed in the drive circuit group D0 to the subsequent stage, the standby signal STB inputted to the first stage of the drive circuit group D0 is inputted to the first stages of the first propagation paths L11 to L1$m$ formed in the drive circuit groups D1 to Dm. That is, the first propagation path L1 is branched into m lines between the drive circuit group D0 and the drive circuit groups D1 to Dm, the lines of which are connected to the first propagation paths L11 to L1$m$.

The standby signal STB inputted to the first stages of the drive circuit groups D1 to Dm successively propagates the first propagation paths L11 to L1$m$ to a subsequent stage, is returned in a final stage, is inputted to the final stages of the second propagation paths L21 to L2$m$ formed in the drive circuit groups D1 to Dm, successively propagates the second propagation paths L21 to L2$m$ to the first stage side, and is outputted from the first stages of the second propagation paths L21 to L2$m$ to the wait circuit 610.

The wait circuit 610 waits until the standby signals STB are inputted from all of the drive circuit groups D1 to Dm and inputs the standby signals STB to the final stages of the second propagation path L2 formed in the drive circuit group D0.

That is, the wait circuit 610 does not output the standby signals STB to the clock tree before the branch until the standby signals STB are returned from all return paths of the branched clock tree (the drive circuit groups D1 to Dm), and outputs the standby signals STB to the clock tree before the branch (the drive circuit group D0) after the standby signals STB are returned from all return paths.

For example, this wait circuit 610 can be constituted of the OR circuit when the standby signal STB is constituted of the negative logic L and can be constituted of the AND circuit when the standby signal STB is constituted of the positive logic H.

Thus, the wait circuit 610 is provided with a branch portion of the clock tree T', so that the standby of the clock tree before the branch can be set automatically in accordance with the path having the slowest propagation in the clock trees after the branch. Therefore, it is possible to prevent the clock signal Clk that a glitch occurs from being externally outputted to the clock tree T.

(7) Seventh Embodiment

Figure 11:
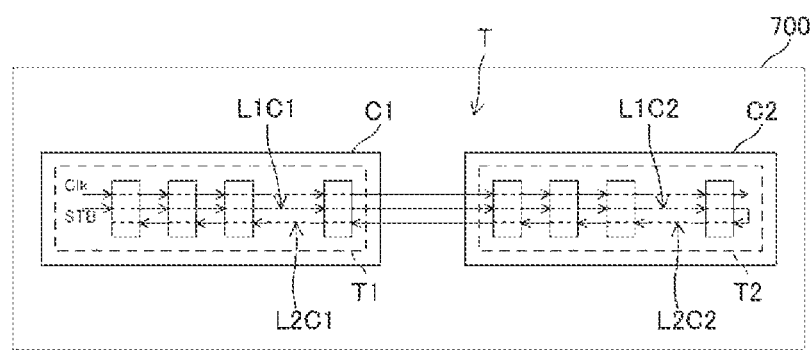
FIG. 11 is a diagram describing a clock tree formed across a plurality of semiconductor devices.

FIG. 11 is a diagram describing a clock tree formed across a plurality of semiconductor devices C1 and C2.

An apparatus 700 described in FIG. 11 includes the semiconductor device C1, the semiconductor device C2, and a clock tree T formed by connecting a plurality of drive circuits in cascade as in any of the foregoing embodiments. This clock tree T is constituted of a clock tree T1 formed in the semiconductor device C1 and a clock tree T2 formed in the semiconductor device C2.

That is, the clock signal Clk is successively propagated through the clock tree T1 in the semiconductor device C1 from a first stage to a final stage, is inputted to the semiconductor device C2 from the semiconductor device C1, and is successively propagated through the clock tree T2 in the semiconductor device C2 from a first stage to a final stage.

Meanwhile, the standby signal STB is successively propagated through a first propagation path L1C1 formed in the clock tree T1 in the semiconductor device C1 from a first stage to a final stage, is inputted to the semiconductor device C2 from the semiconductor device C1, and is successively propagated through a first propagation path L1C2 formed in the clock tree T2 in the semiconductor device C2 from a first stage to a final stage. The standby signal STB reaching the final stage of the first propagation path L1C2 is returned and inputted to a final stage of a second propagation path L2C2 formed in the clock tree T2 in the semiconductor device C2, is successively propagated through the second propagation path L2C2 from a first stage to a final stage and inputted to the semiconductor device C1 from the semiconductor device C2, and is successively propagated through the second propagation path L2C2 formed in the clock tree T1 in the semiconductor device C1 from the first stage to the final stage.

Thus, even in the case of the clock tree T formed across the plurality of semiconductor devices C1 and C2, it is possible to prevent the clock signal Clk that a glitch occurs from being externally outputted to the clock tree T.

It should be noted that the present technology is not limited to the foregoing embodiments. The present technology may also include configurations that replace the configurations disclosed in the foregoing embodiments with one another or change a combination thereof, or configurations that replace the configurations disclosed in a known technology and the foregoing embodiments with one another or change a combination thereof, and the like. Moreover, the technical scope of the present technology is not limited to the foregoing embodiments, but covers elements and matters described in the appended claims and the equivalents thereof.

It should be noted that the present technology may have the following configurations.

(a) A clock tree unit cell circuit, including: a first input terminal configured to receive a clock signal from an upstream side of a clock tree; a first output terminal configured to output a clock signal to a downstream side of the clock tree; a second input terminal configured to receive a standby signal from the upstream side of the clock tree; a third input terminal configured to receive a standby signal from the downstream side of the clock tree; a logic circuit configured to perform a predetermined logical operation on the clock signal inputted to the first input terminal and output the clock signal to the first output terminal; and a control circuit that is connected to the second input terminal, the third input terminal, and an output control terminal of the logic circuit.

(b) The clock tree unit cell circuit according to Item (a), further including: a second output terminal that is connected to a subsequent stage of the clock tree; a third output terminal that is connected to a preceding stage of the clock tree; a first delay circuit configured to delay the standby signal inputted to the second input terminal and output the standby signal to the second output terminal; and a second delay circuit configured to delay the standby signal inputted to the third input terminal and output the standby signal to the third output terminal.

(c) The clock tree unit cell circuit according to Item (a) or (b), in which the first delay circuit has an output delay time longer than an output delay time of the logic circuit.

(d) The clock tree unit cell circuit according to any one of Items (a) to (c), in which the first delay circuit is a NAND circuit.

(e) The clock tree unit cell circuit according to Item (d), in which the NAND circuit includes a first PMOS transistor, a first NMOS transistor, a second NMOS transistor, and a second PMOS transistor, the first PMOS transistor, the first NMOS transistor, the second NMOS transistor are connected in cascode in the stated order between a constant voltage source and a ground, the first PMOS transistor and the first NMOS transistor include gates that are connected to the first input terminal, the first PMOS transistor and the first NMOS transistor include drains having a connection node therebetween that is connected to the first output terminal, the second PMOS transistor is connected by drain and source between the constant voltage source and the first output terminal, and the second NMOS transistor and the second PMOS transistor include gates each configured to receive a control signal outputted by the control circuit.

(f) The clock tree unit cell circuit according to Item (e), in which the second NMOS transistor has a size larger than the first NMOS transistor.

(g) The clock tree unit cell circuit according to Item (e) or (f), in which the second PMOS transistor has a size smaller than the first PMOS transistor.

(h) The clock tree unit cell circuit according to any one of Items (e) to (g), in which the standby signal is a negative logic signal, and the clock signal to be inputted to the first input terminal is fixed to positive logic at standby.

(i) The clock tree unit cell circuit according to any one of Items (a) to (c), in which the logic circuit is a NOR circuit.

(j) The clock tree unit cell circuit according to Item (i), in which the NOR circuit includes a third PMOS transistor, a third NMOS transistor, a fourth NMOS transistor, and a fourth PMOS transistor, the fourth PMOS transistor, the third PMOS transistor, the third NMOS transistor are connected in cascode in the stated order between a constant voltage source and a ground, the third PMOS transistor and the third NMOS transistor include gates that are connected to the first input terminal, the third PMOS transistor and the third NMOS transistor include drains having a connection node therebetween that is connected to the first output terminal, the fourth NMOS transistor is connected by drain and source between the first output terminal and a ground, and the fourth NMOS transistor and the fourth PMOS transistor include gates each configured to receive a control signal outputted by the control circuit.

(k) The clock tree unit cell circuit according to Item (j), in which the fourth PMOS transistor has a size larger than the third PMOS transistor.

(l) The clock tree unit cell circuit according to Item (j) or (k), in which the fourth PMOS transistor has a size smaller than the third PMOS transistor.

(m) The clock tree unit cell circuit according to any one of Items (j) to (l), in which the standby signal is a positive logic signal, and the clock signal to be inputted to the first input terminal is fixed to negative logic at standby.

(n) A clock tree, including a circuit including a first input terminal configured to receive a clock signal from an upstream side of the clock tree, a first output terminal configured to output a clock signal to a downstream side of the clock tree, a second input terminal configured to receive a standby signal from the upstream side of the clock tree, a second output terminal configured to output the standby signal inputted to the second input terminal to the downstream side of the clock tree, a third input terminal configured to receive a standby signal from the downstream side of the clock tree, a third output terminal configured to output the standby signal inputted to the third input terminal to the upstream side of the clock tree, a logic circuit configured to output, to the first output terminal, a clock signal generated by performing a predetermined logical operation on the clock signal inputted to the first input terminal, and a control circuit that is connected to the second input terminal, the third input terminal, and an output control terminal of the logic circuit, the circuits including the first output terminal that is connected to the first input terminal of the circuit on the downstream side, the second output terminal that is connected to the second input terminal of the circuit on the downstream side, and the third input terminal that is connected to the third output terminal of the circuit on the downstream side, the second output terminal of the circuit in a final stage being connected to the third input terminal of the circuit in the final stage.

(o) The clock tree according to Item (n), further including a branch point, in which the third input terminal of the circuit at an immediately upstream of the branch point and the third output terminal of the plurality of circuits at an immediately downstream of the branch point are connected through a wait circuit, and when receiving the standby signal from the third output terminal of all the plurality of circuits at the immediately downstream of the branch point, the wait circuit outputs the standby signal to the third input terminal of the circuit at the immediately upstream of the branch point.

(p) The clock tree according to Item (n) or (o), in which the clock signal outputted by the circuit constituting an even-number stage of the clock tree is used as output.

(q) An apparatus including the clock tree according to any one of Items (n) to (o) that is formed across a plurality of semiconductor devices.

It should be understood by those skilled in the art that various modifications, combinations, sub-combinations and alterations may occur depending on design requirements and other factors insofar as they are within the scope of the appended claims or the equivalents thereof.

What is claimed is:

1. A clock tree unit cell circuit, comprising:
    a first input terminal configured to receive a clock signal from an upstream side of a clock tree;
    a first output terminal configured to output a clock signal to a downstream side of the clock tree;
    a second input terminal configured to receive a standby signal from the upstream side of the clock tree;
    a third input terminal configured to receive a standby signal from the downstream side of the clock tree;
    a logic circuit configured to perform a predetermined logical operation on the clock signal inputted to the first input terminal and output the clock signal to the first output terminal; and
    a control circuit that is connected to the second input terminal, the third input terminal, and an output control terminal of the logic circuit.

2. The clock tree unit cell circuit according to claim 1, further comprising:
    a second output terminal that is connected to a subsequent stage of the clock tree;
    a third output terminal that is connected to a preceding stage of the clock tree;
    a first delay circuit configured to delay the standby signal inputted to the second input terminal and output the standby signal to the second output terminal; and
    a second delay circuit configured to delay the standby signal inputted to the third input terminal and output the standby signal to the third output terminal.

3. The clock tree unit cell circuit according to claim 2, wherein
    the first delay circuit has an output delay time longer than an output delay time of the logic circuit.

4. The clock tree unit cell circuit according to claim 2, wherein
    the first delay circuit is a NAND circuit.

5. The clock tree unit cell circuit according to claim 4, wherein
    the NAND circuit includes a first P-channel metal-oxide-semiconductor (PMOS) transistor, a first N-channel metal-oxide semiconductor (NMOS) transistor, a second NMOS transistor, and a second PMOS transistor,
    the first PMOS transistor, the first NMOS transistor, the second NMOS transistor are connected in cascode in the stated order between a constant voltage source and a ground,
    the first PMOS transistor and the first NMOS transistor include gates that are connected to the first input terminal,
    the first PMOS transistor and the first NMOS transistor include drains having a connection node therebetween that is connected to the first output terminal,
    the second PMOS transistor is connected by drain and source between the constant voltage source and the first output terminal, and
    the second NMOS transistor and the second PMOS transistor include gates each configured to receive a control signal outputted by the control circuit.

6. The clock tree unit cell circuit according to claim 5, wherein
    the second NMOS transistor has a size larger than the first NMOS transistor.

7. The clock tree unit cell circuit according to claim 5, wherein
    the second PMOS transistor has a size smaller than the first PMOS transistor.

8. The clock tree unit cell circuit according to claim 5, wherein
    the standby signal is a negative logic signal, and
    the clock signal to be inputted to the first input terminal is fixed to positive logic at standby.

9. The clock tree unit cell circuit according to claim 1, wherein
    the logic circuit is a NOR circuit.

10. The clock tree unit cell circuit according to claim 9, wherein
    the NOR circuit includes a third PMOS transistor, a third NMOS transistor, a fourth NMOS transistor, and a fourth PMOS transistor,
    the fourth PMOS transistor, the third PMOS transistor, the third NMOS transistor are connected in cascode in the stated order between a constant voltage source and a ground,
    the third PMOS transistor and the third NMOS transistor include gates that are connected to the first input terminal, the third PMOS transistor and the third NMOS transistor include drains having a connection node therebetween that is connected to the first output terminal, the fourth NMOS transistor is connected by drain and source between the first output terminal and a ground, and the fourth NMOS transistor and the fourth PMOS transistor include gates each configured to receive a control signal outputted by the control circuit.

11. The clock tree unit cell circuit according to claim 10, wherein
the fourth PMOS transistor has a size larger than the third PMOS transistor.

12. The clock tree unit cell circuit according to claim 10, wherein
the fourth PMOS transistor has a size smaller than the third PMOS transistor.

13. The clock tree unit cell circuit according to claim 10, wherein
the standby signal is a positive logic signal, and
the clock signal to be inputted to the first input terminal is fixed to negative logic at standby.

14. A clock tree, comprising
a plurality of unit circuits, each including
a first input terminal configured to receive a clock signal from an upstream side of the clock tree,
a first output terminal configured to output a clock signal to a downstream side of the clock tree,
a second input terminal configured to receive a standby signal from the upstream side of the clock tree,
a second output terminal configured to output the standby signal inputted to the second input terminal to the downstream side of the clock tree,
a third input terminal configured to receive a standby signal from the downstream side of the clock tree;
a third output terminal configured to output the standby signal inputted to the third input terminal to the upstream side of the clock tree,
a logic circuit configured to output, to the first output terminal, a clock signal generated by performing a predetermined logical operation on the clock signal inputted to the first input terminal, and
a control circuit that is connected to the second input terminal, the third input terminal, and an output control terminal of the logic circuit,
wherein for each of the plurality of unit circuits, the first output terminal of the respective unit circuit is connected to the first input terminal of the unit circuit on the downstream side, the second output terminal of the respective unit circuit is connected to the second input terminal of the unit circuit on the downstream side, and the third input terminal of the respective unit circuit is connected to the third output terminal of the unit circuit on the downstream side, except that the second output terminal of a final stage unit circuit is connected to the third input terminal of the final stage unit circuit.

15. The clock tree according to claim 14, further comprising
a branch point, wherein
a given unit circuit of the plurality of unit circuits is immediately upstream of the branch point and n branching unit circuits of the plurality of unit circuits are immediately downstream of the branch point, where n>1,
the third input terminal of the given unit circuit and the third output terminal of each of the n branching unit circuits are connected through a wait circuit, and
when receiving the standby signal from the third output terminal of all the n branching unit circuits, the wait circuit outputs the standby signal to the third input terminal of the given unit circuit.

16. The clock tree according to claim 14, wherein
the clock signal outputted by one of the plurality of unit circuits that constitutes an even-number stage of the clock tree is used as an output of the clock tree.

17. An apparatus comprising
the clock tree according to claim 14 that is formed across a plurality of semiconductor devices.

* * * * *